United States Patent
Kagaya et al.

(10) Patent No.: US 12,312,683 B2
(45) Date of Patent: May 27, 2025

(54) SUBSTRATE PROCESSING METHOD AND SUBSTRATE PROCESSING DEVICE

(71) Applicant: Tokyo Electron Limited, Tokyo (JP)

(72) Inventors: Munehito Kagaya, Nirasaki (JP); Tadashi Mitsunari, Nirasaki (JP); Hiroyuki Onoda, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 195 days.

(21) Appl. No.: 17/756,214

(22) PCT Filed: Nov. 10, 2020

(86) PCT No.: PCT/JP2020/041952
§ 371 (c)(1),
(2) Date: May 19, 2022

(87) PCT Pub. No.: WO2021/100560
PCT Pub. Date: May 27, 2021

(65) Prior Publication Data
US 2022/0411920 A1     Dec. 29, 2022

(30) Foreign Application Priority Data
Nov. 21, 2019 (JP) .................................. 2019-210529

(51) Int. Cl.
*C23C 16/34*     (2006.01)
*C23C 16/04*     (2006.01)
(Continued)

(52) U.S. Cl.
CPC .......... *C23C 16/345* (2013.01); *C23C 16/045* (2013.01); *C23C 16/45542* (2013.01);
(Continued)

(58) Field of Classification Search
CPC ................ C23C 16/345; C23C 16/045; C23C 16/45542
See application file for complete search history.

(56) References Cited

U.S. PATENT DOCUMENTS 6,358,839 B1 * 3/2002 Li ..................... H01L 21/76807
                                                        438/669
9,754,779 B1 * 9/2017 Ishikawa ................. C23C 16/56
(Continued)

FOREIGN PATENT DOCUMENTS

| JP | 2014-112668 A | 6/2014 |
| JP | 2015-510263 A | 4/2015 |

(Continued)

OTHER PUBLICATIONS

Nowling, G R, et al., "Remote plasma-enhanced chemical vapour deposition of silicon nitride at atmospheric pressure". Plasma Sources Sci. Technol. 11 (2002) 97-103.*
(Continued)

*Primary Examiner* — Bret P Chen
(74) *Attorney, Agent, or Firm* — Armstrong Teasdale LLP

(57) ABSTRACT

The present disclosure provides a substrate processing method and a substrate processing apparatus that perform selective film formation. The substrate processing method includes: forming a silicon-containing film by repeating forming an adsorption layer on a substrate on which a pattern of a concave portion is formed by supplying a silicon-containing gas to the substrate and generating plasma of a reaction gas to cause the plasma to react with the adsorption layer; and etching the silicon-containing film, wherein the forming the silicon-containing film includes modifying at least one of the adsorption layer and the silicon-containing film by generating a He-containing plasma.

17 Claims, 7 Drawing Sheets

(51) Int. Cl.
  *C23C 16/455* (2006.01)
  *C23C 16/505* (2006.01)
  *C23C 16/56* (2006.01)

(52) U.S. Cl.
  CPC .. *C23C 16/45544* (2013.01); *C23C 16/45553* (2013.01); *C23C 16/505* (2013.01); *C23C 16/56* (2013.01)

(56) References Cited

U.S. PATENT DOCUMENTS

| | | | |
|---|---|---|---|
| 9,793,135 B1* | 10/2017 | Zaitsu | H01L 21/30655 |
| 10,388,513 B1* | 8/2019 | Blanquart | C23C 16/56 |
| 2009/0261403 A1* | 10/2009 | Sekine | H01L 29/513 257/E21.21 |
| 2011/0151142 A1* | 6/2011 | Seamons | C23C 16/4401 427/579 |
| 2013/0005140 A1* | 1/2013 | Jeng | C23C 16/045 438/653 |
| 2013/0032888 A1* | 2/2013 | Murata | H01L 29/7843 257/E21.409 |
| 2015/0099375 A1* | 4/2015 | Haripin | H01L 21/0217 438/793 |
| 2016/0276183 A1* | 9/2016 | Ohashi | H01J 37/32192 |
| 2019/0051511 A1* | 2/2019 | Kato | H01J 37/32449 |

FOREIGN PATENT DOCUMENTS

| | | | | |
|---|---|---|---|---|
| JP | 2017-11136 | * | 1/2017 | H01L 21/316 |
| JP | 2017-118035 A | | 6/2017 | |
| JP | 2018-117038 A | | 7/2018 | |
| KR | 20140038902 A | * | 3/2014 | H05H 1/46 |
| WO | WO 2011033987 A1 | * | 3/2011 | H01L 21/316 |

OTHER PUBLICATIONS

Morin, Pierre, et al., "Study of stress in tensile nitrogen-plasma-treated multilayer silicon nitride films". J. Vac. Sci. Technol. A 29(4), Jul./Aug. 2011, 041513-1 to 041513-8.*
Gupta, Manju, et al., "The Preparation, Properties and Applications of Silicon Nitride Thin Films Deposited by Plasma-Enhanced Chemical Vapor Deposition". Thin Solid Films, 204 (1991) 77-106.*
Claassen, W.A.P., et al., "Characterization of Plasma Silicon Nitride Layers". J. Electrochem. Soc.: Solid-State Science and Technology, 130, Dec. 1983, 2419-2423.*
Wang, Haoru, et al., "Helium ion penetration in sputtering cathode materials: A crucial process for the helium treatment of oxide thin films". Thin Solid Films 713 (2020) 138339, pp. 1-5.*
Barankin, M.D., et al., "Plasma-enhanced chemical vapor deposition of zinc oxide at atmospheric pressure and low temperature". Solar Energy Materials & Solar Cells 91 (2007) 924-930.*
Van Gelder, W., et al., "The Etching of Silicon Nitride in Phosphoric Acid with Silicon Dioxide as a Mask". Journal of the Electro-Chemical Society: Solid-State Science Magazine, Aug. 1967, Pub: 15-A143-0298, pp. 1-5.*

* cited by examiner

Repeating by predetermined cycles

SUBSTRATE PROCESSING METHOD AND SUBSTRATE PROCESSING DEVICE

CROSS-REFERENCE TO RELATED APPLICATIONS

The present application is a U.S. National Stage Entry of International Patent Application No. PCT/JP2020/041952, filed Nov. 10, 2020, which claims the benefit of priority to Japanese Patent Application No. 2019-210529, filed Nov. 21, 2019, each of which is hereby incorporated herein by reference in its entirety.

TECHNICAL FIELD

The present disclosure relates to a substrate processing method and a substrate processing apparatus.

BACKGROUND

For example, a substrate processing method of forming a film at a desired location is known.

Patent Document 1 discloses a protective film forming method of performing selective film formation on a flat surface between recessed shapes such as trenches by nitriding only the vicinity of the outermost surface of a wafer to form an adsorption site while supplying a fluorine-containing gas to a Si-containing base film to form an adsorption-inhibiting group, and then performing film formation.

PRIOR ART DOCUMENTS

Patent Document

Patent Document 1: Japanese Laid-Open Patent Publication No. 2018-117038

In an aspect, the present disclosure provides a substrate processing method and a substrate processing apparatus that perform selective film formation.

SUMMARY

In order to solve the above matters, according to an aspect, provided is a substrate processing method including: forming a silicon-containing film by repeating supplying a silicon-containing gas to a substrate on which a pattern of a concave portion is formed so as to form an adsorption layer on the substrate, and generating plasma of a reaction gas to cause the plasma to react with the adsorption layer; and etching the silicon-containing film, wherein the forming the silicon-containing film includes modifying at least one of the adsorption layer and the silicon-containing film by generating plasma containing He.

According to an aspect, it is possible to provide a substrate processing method and a substrate processing apparatus that perform selective film formation.

DETAILED DESCRIPTION

Figure 1:
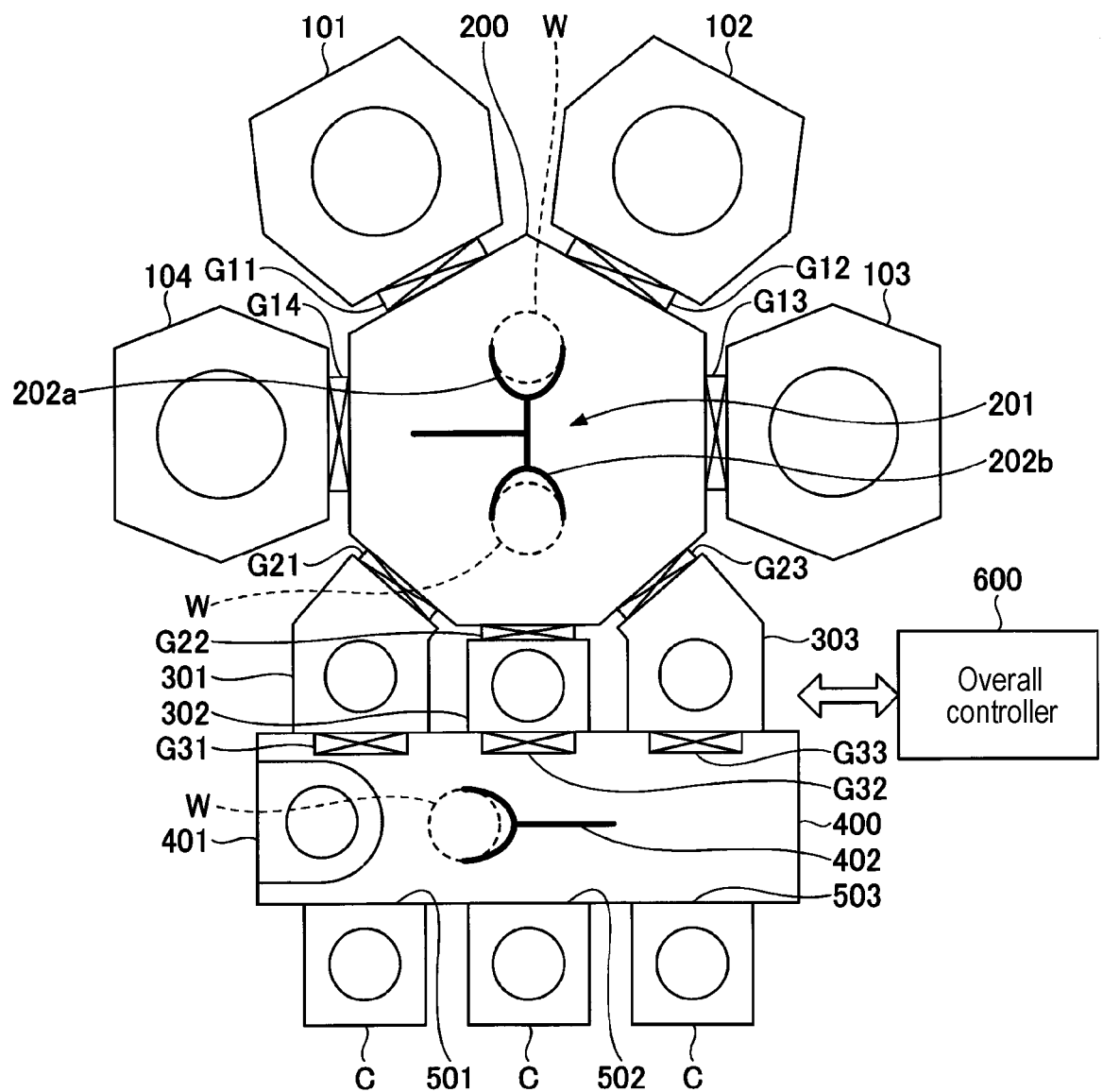
FIG. 1 is a schematic view illustrating a configuration example of a substrate processing system.

Hereinafter, embodiments of the present disclosure will be described with reference to the accompanying drawings. In each of the drawings, the same components will be denoted by the same reference numerals, and redundant descriptions thereof may be omitted.

[Substrate Processing System]

A substrate processing system according to the present embodiment will be described with reference to FIG. 1. FIG. 1 is a schematic view illustrating a configuration example of the substrate processing system.

As illustrated in FIG. 1, the substrate processing system includes processing apparatuses 101 to 104, a vacuum transfer chamber 200, load-lock chambers 301 to 303, an atmospheric transfer chamber 400, and load ports 501 to 503, and an overall controller 600.

The processing apparatuses 101 to 104 are connected to the vacuum transfer chamber 200 via gate valves G11 to G14, respectively. The interiors of the processing apparatuses 101 to 104 are depressurized to a predetermined vacuum atmosphere so as to perform a desired processing on a wafer W. In an embodiment, the processing apparatus 101 is an apparatus that forms a SiN film on the wafer W. The processing apparatus 102 is an apparatus that etches the SiN film formed in the processing apparatus 101. Each of the processing apparatuses 103 and 104 may be an apparatus that is the same as any of the processing apparatuses 101 and 102, or may be an apparatus that performs other processing.

The interior of the vacuum transfer chamber 200 is depressurized to a predetermined vacuum atmosphere. The vacuum transfer chamber 200 is provided with a transfer mechanism 201 capable of transferring the wafer W in the depressurized state. The transfer mechanism 201 transfers the wafer W to the processing apparatuses 101 to 104 and the load-lock chambers 301 to 303. The transfer mechanism 201 includes, for example, two transfer arms 202a and 202b.

The load-lock chambers 301 to 303 are connected to the vacuum transfer chamber 200 via gate valves G21 to G23, respectively, and connected to the atmospheric transfer chamber 400 via gate valves G31 to G33, respectively. The interior of each of the load-lock chambers 301 to 303 is configured to be capable of being switched between an air atmosphere and a vacuum atmosphere.

The interior of the atmospheric transfer chamber 400 is kept in an air atmosphere. For example, a down-flow of clean air is formed in the interior of the atmospheric transfer chamber 400. Inside the atmospheric transfer chamber 400, an aligner 401 is provided to perform alignment of the wafers W. In addition, the atmospheric transfer chamber 400 is provided with a transfer mechanism 402. The transfer mechanism 402 transfers the wafer W to the load-lock chambers 301 to 303, carriers C in the load ports 501 to 503 to be described later, and the aligner 401.

The load ports 501 to 503 are provided in the wall of a long side of the atmospheric transfer chamber 400. The carrier C in which the wafers W are accommodated or an empty carrier C is mounted in each of the load ports 501 to 503. As the carrier C, for example, a front opening unified pod (FOUP) may be used.

The overall controller 600 controls respective parts of the substrate processing system. For example, the overall controller 600 executes the operations of the processing apparatuses 101 to 104, the operations of the transfer mechanisms 201 and 402, the opening/closing of the gate valves G11 to G14, G21 to G23, and G31 to G33, the switching of the internal atmosphere of each of the load-lock chambers 301 to 303, and the like. The overall controller 600 may be, for example, a computer In addition, the configuration of the substrate processing system is not limited to the above. The substrate processing system may be configured to include a multi-wafer apparatus for processing a plurality of wafers W with a single apparatus, may be configured such that a vacuum transfer chamber is also connected to the multi-wafer apparatus via a gate valve, or may be configured such that a plurality of vacuum transfer apparatuses is connected to the substrate processing system.

Figure 2:
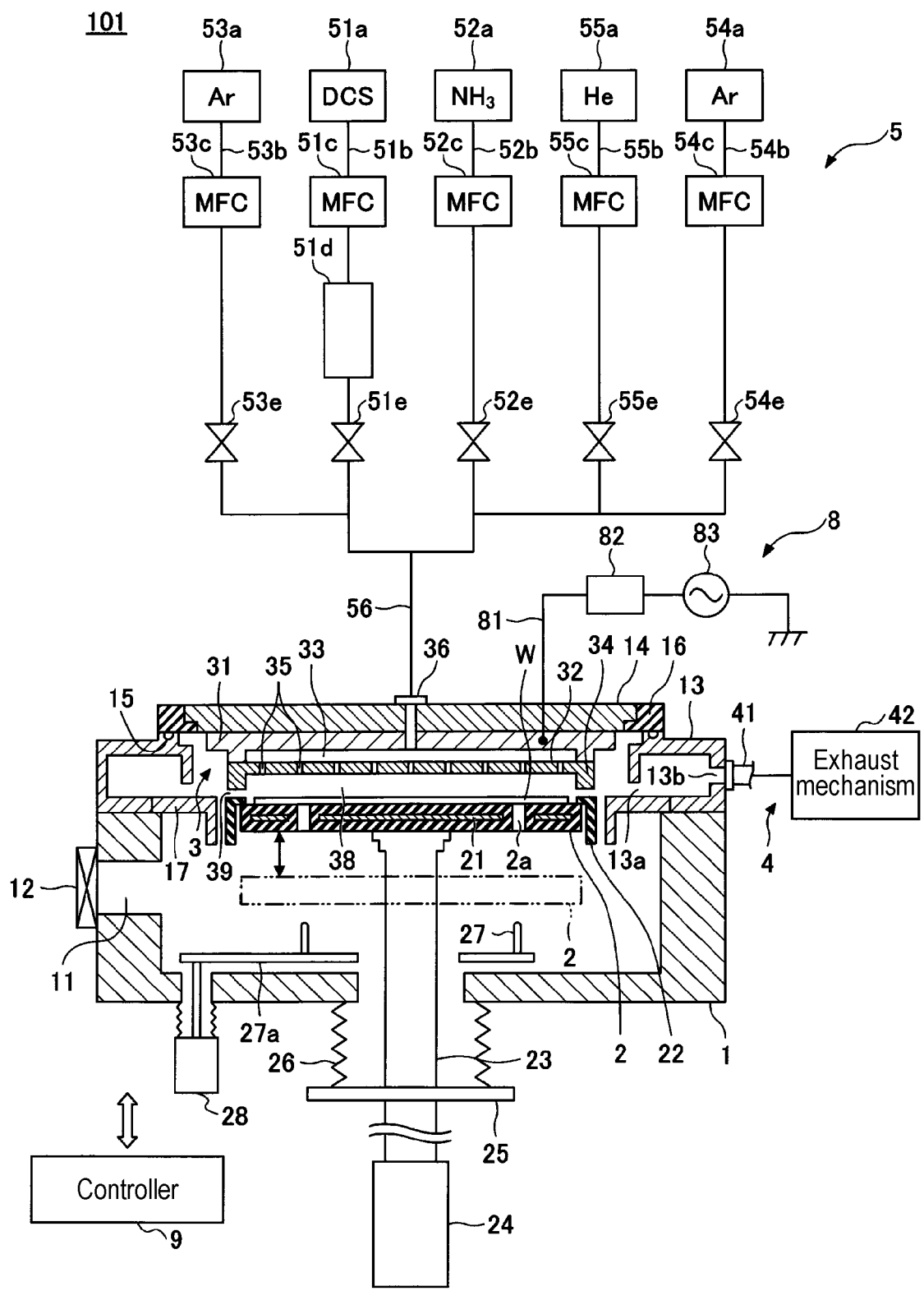
FIG. 2 is a schematic view illustrating a configuration example of a first processing apparatus.

Next, an exemplary configuration of the processing apparatus 101 will be described. The processing apparatus 101 is an example of a first processing apparatus that forms a SiN film by a plasma enhanced atomic layer deposition (PE-ALD) method within a processing container kept in a depressurized state. FIG. 2 is a schematic view illustrating the configuration example of the processing apparatus 101.

As illustrated in FIG. 2, the processing apparatus 101 includes a processing container 1, a stage 2, a shower head 3, an exhauster 4, a gas supply mechanism 5, an RF power supply 8, and a controller 9.

The processing container 1 is made of a metal such as aluminum, and has a substantially cylindrical shape. The processing container 1 accommodates the wafer W. A carry-in/out port 11 for carrying in or carrying out the wafer W therethrough is formed in the sidewall of the processing container 1. The carry-in/out port 11 is opened/closed by a gate valve 12. An annular exhaust duct 13 having a rectangular cross section is provided on a main body of the processing container 1. A slit 13a is formed along an inner peripheral surface of the exhaust duct 13. An exhaust port 13b is formed in an outer wall of the exhaust duct 13. On a top surface of the exhaust duct 13, a ceiling wall 14 is provided to close an upper opening of the processing container 1 via an insulator member 16. A space between the exhaust duct 13 and the insulator member 16 is hermetically sealed with a seal ring 15. A partition member 17 partitions the interior of the processing container 1 into upper and lower portions when the stage 2 (and a cover member 22) is raised to a processing position (to be described later).

The stage 2 horizontally supports the wafer W inside the processing container 1. The stage 2 is formed in a disk shape having a size corresponding to the wafer W, and is supported by a support member 23. The stage 2 is formed of a ceramic material such as AlN or a metallic material such as aluminum or a nickel alloy. A heater 21 for heating the wafer W is embedded in the stage 2. The heater 21 generates heat using power from a heater power supply (not illustrated). In addition, the wafer W is controlled to have a predetermined temperature by controlling the output of the heater 21 by a temperature signal of a thermocouple (not illustrated) provided in the vicinity of the top surface of the stage 2. The cover member 22 formed of ceramic, such as alumina, is provided on the stage 2 to cover an outer peripheral region of the top surface and a side surface of the stage 2.

The support member 23 that supports the stage 2 is provided on the bottom surface of the stage 2. The support member 23 extends from the center of the bottom surface of the stage 2 downward of the processing container 1 through a hole formed in the bottom wall of the processing container 1. A lower end of the support member 23 is connected to a lifting mechanism 24. By the lifting mechanism 24, the stage 2 is raised and lowered between a processing position illustrated in FIG. 1 and a transfer position indicated by the alternate long and two short dash line below the processing position through the support member 23. At the transfer position, the wafer W is capable of being transferred. A flange 25 is provided on the support member 23 below the processing container 1. A bellows 26, which is configured to isolate an internal atmosphere of the processing container 1 from ambient air and to be flexible with the vertical movement of the stage 2, is provided between the bottom surface of the processing container 1 and the flange 25.

Three wafer support pins 27 (of which only two are illustrated) are provided in the vicinity of the bottom surface of the processing container 1 to protrude upward from a lifting plate 27a. The wafer support pins 27 are moved upward and downward via the lifting plate 27a by a lifting mechanism 28 provided below the processing container 1. The wafer support pins 27 are inserted through respective through-holes 2a provided in the stage 2 located at the transfer position and are configured to move upward and downward with respect to the top surface of the stage 2. By raising/lowering the wafer support pins 27, the wafer W is delivered between a wafer transfer mechanism (not illustrated) and the stage 2.

The shower head 3 supplies a processing gas into the processing container 1 in the form of a shower. The shower head 3 is made of a metal and provided to face the stage 2, and has a diameter, which is substantially equal to that of the stage 2. The shower head 3 includes a main body 31 fixed to the ceiling wall 14 of the processing container 1 and a shower plate 32 connected to the lower side of the main body 31. A gas diffusion space 33 is formed between the main body 31 and the shower plate 32 and is provided with a gas introduction hole 36 to penetrate the centers of the ceiling wall 14 of the processing container 1 and the main body 31. An annular protrusion 34 protruding downward is formed on a peripheral edge portion of the shower plate 32. Gas ejection holes 35 are formed in a flat surface inside the annular protrusion 34. In the state in which the stage 2 is located at the processing position, a processing space 38 is formed between the stage 2 and the shower plate 32, and the top surface of the cover member 22 and the annular protrusion 34 are close to each other to form an annular gap 39.

The exhauster 4 exhausts the interior of the processing container 1. The exhauster 4 includes an exhaust pipe 41 connected to the exhaust port 13b, and an exhaust mechanism 42 connected to the exhaust pipe 41 and including a vacuum pump, a pressure control valve, and the like. During a process, the gas in the processing container 1 reaches the exhaust duct 13 via the slit 13a, and is exhausted from the exhaust duct 13 through the exhaust pipe 41 by the exhaust mechanism 42.

The gas supply mechanism 5 supplies a processing gas into the processing container 1. The gas supply mechanism 5 includes a precursor gas source 51a, a reaction gas source 52a, an Ar gas source 53a, an Ar gas source 54a, and a He gas source 55a.

The precursor gas source 51a supplies a precursor gas into the processing container 1 through a gas supply line 51b. In the example illustrated in FIG. 2, a dichlorosilane (DCS) gas is used as the precursor gas. In the gas supply line 51b, a flow rate controller 51c, a storage tank 51d, and a valve 51e are interposed from an upstream side. A downstream side of the valve 51e of the gas supply line 51b is connected to the gas introduction hole 36 through the gas supply line 56. The precursor gas supplied from the precursor gas source 51a is temporarily stored in the storage tank 51d before being supplied into the processing container 1, is boosted to a predetermined pressure inside the storage tank 51d, and is then supplied into the processing container 1. The supply and cutoff of the precursor gas from the storage tank 51d to the processing container 1 are performed by opening/closing the valve 51e. By temporarily storing the precursor gas inside the storage tank 51d as described above, it is possible to stably supply the precursor gas into the processing container 1 at a relatively large flow rate.

The reaction gas source 52a supplies a reaction gas into the processing container 1 through a gas supply line 52b. In the example illustrated in FIG. 2, a $NH_3$ gas is used as the reaction gas. In the gas supply line 52b, a flow rate controller 52c and a valve 52e are interposed from an upstream side. A downstream side of the valve 52e of the gas supply line 52b is connected to the gas introduction hole 36 through the gas supply line 56. The reaction gas supplied from the reaction gas source 52a is supplied into the processing container 1. The supply and cutoff of the reaction gas to the processing container 1 are performed by opening/closing the valve 52e.

The Ar gas source 53a supplies an Ar gas as a purge gas into the processing container 1 through a gas supply line 53b. In the gas supply line 53b, a flow rate controller 53c and a valve 53e are interposed from an upstream side. A downstream side of the valve 53e of the gas supply line 53b is connected to the gas supply line 51b. The Ar gas supplied from the Ar gas source 53a is supplied into the processing container 1. The supply and cutoff of the Ar gas to the processing container 1 are performed by opening/closing the valve 53e.

The Ar gas source 54a supplies an Ar gas as a purge gas into the processing container 1 through a gas supply line 54b. In the gas supply line 54b, a flow rate controller 54c and a valve 54e are interposed from an upstream side. A downstream side of the valve 54e of the gas supply line 54b is connected to the gas supply line 52b. The Ar gas supplied from the Ar gas source 54a is supplied into the processing container 1. The supply and cutoff of the Ar gas to the processing container 1 are performed by opening/closing the valve 54e.

The He gas source 55a supplies a He gas as a modifying gas for modifying a film into the processing container 1 through a gas supply line 55b. In the gas supply line 55b, a flow rate controller 55c and a valve 55e are interposed from an upstream side. A downstream side of the valve 55e of the gas supply line 55b is connected to the gas supply line 52b. The He gas supplied from the He gas source 55a is supplied into the processing container 1. The supply and cutoff of the He gas to the processing container 1 are performed by opening/closing the valve 55e.

In addition, the processing apparatus 101 is a capacitively coupled plasma apparatus, in which the stage 2 serves as a lower electrode and the shower head 3 serves as an upper electrode. The stage 2 serving as the lower electrode is grounded via a capacitor (not illustrated).

Radio-frequency power (hereinafter, also referred to as "RF power") is applied to the shower head 3 serving as the upper electrode by the RF power supply 8. The RF power supply 8 includes a feeding line 81, a matcher 82, and a radio-frequency power source 83. The radio-frequency power source 83 is a power source that generates radio-frequency power. The radio-frequency power has a frequency suitable for plasma generation. A frequency of the radio-frequency power is, for example, a frequency in the range of 450 KHz to 100 MHz. The radio-frequency power source 83 is connected to the main body 31 of the shower head 3 via the matcher 82 and the feeding line 81. The matcher 82 includes a circuit for matching an output reactance of the radio-frequency power source 83 and a reactance of a load (the upper electrode). Although the RF power supply 8 has been described as applying the radio-frequency power to the shower head 3 serving as the upper electrode, the present disclosure is not limited thereto. The RF power supply 8 may be configured to apply the radio-frequency power to the stage 2 serving as the lower electrode.

The controller 9 is, for example, a computer, and includes a central processing unit (CPU), a random access memory (RAM), a read only memory (ROM), an auxiliary storage device, and the like. The CPU operates based on a program stored in the ROM or the auxiliary storage device and controls the operation of the processing apparatus 101. The controller 9 may be provided either inside or outside the processing apparatus 101. In the case in which the controller 9 is provided outside the processing apparatus 101, the controller 9 is capable of controlling the processing apparatus 101 through a wired or wireless communication mechanism.

Next, returning to FIG. 1, the processing apparatus 102 will be described. The processing apparatus 102 is an example of a second processing apparatus that performs etching process. The processing apparatus 102 is, for example, a dry etching apparatus, and etches the SiN film formed on the wafer W with plasma of an etching gas. The processing apparatus 102 may be an atomic layer etching (ALE) apparatus, but is not limited thereto. The processing apparatus 102 may be provided as a separate apparatus without being connected to the substrate processing system, and may be, for example, a wet etching apparatus using dilute hydrofluoric acid (DHF), in which the SiN film formed on the wafer W may be wet-etched.

Figure 3:
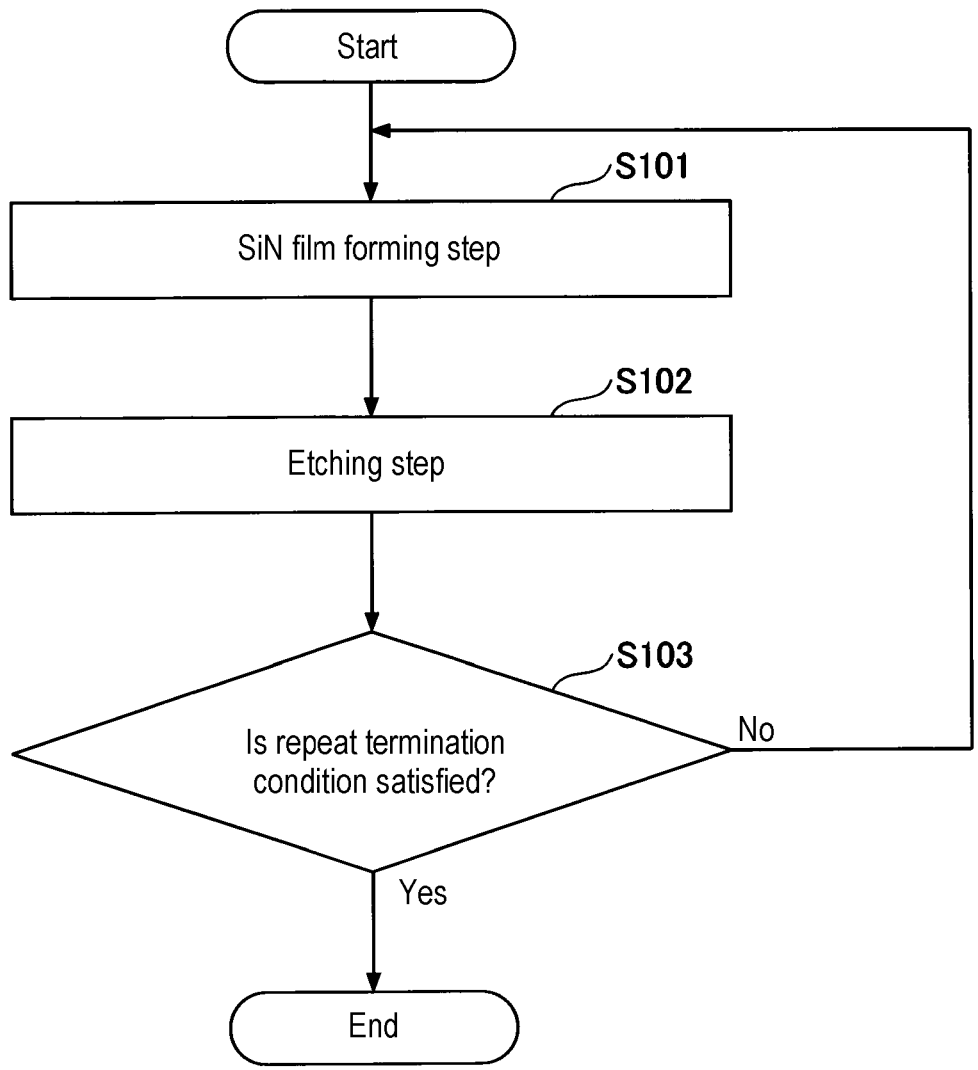
FIG. 3 is a flowchart illustrating an example of substrate processing performed by the substrate processing system.

Next, an example of substrate processing performed by the substrate processing system illustrated in FIG. 1 will be described. FIG. 3 is a flowchart illustrating an example of the substrate processing performed by the substrate processing system. In the wafer W in which an uneven pattern such as a trench is formed, the substrate processing system selectively forms the SiN film on the pattern.

In step S101, the SiN film is formed on the wafer W in which an uneven pattern such as a trench is formed (SiN film forming step). This step is performed in, for example, the processing apparatus 101.

Figure 4:
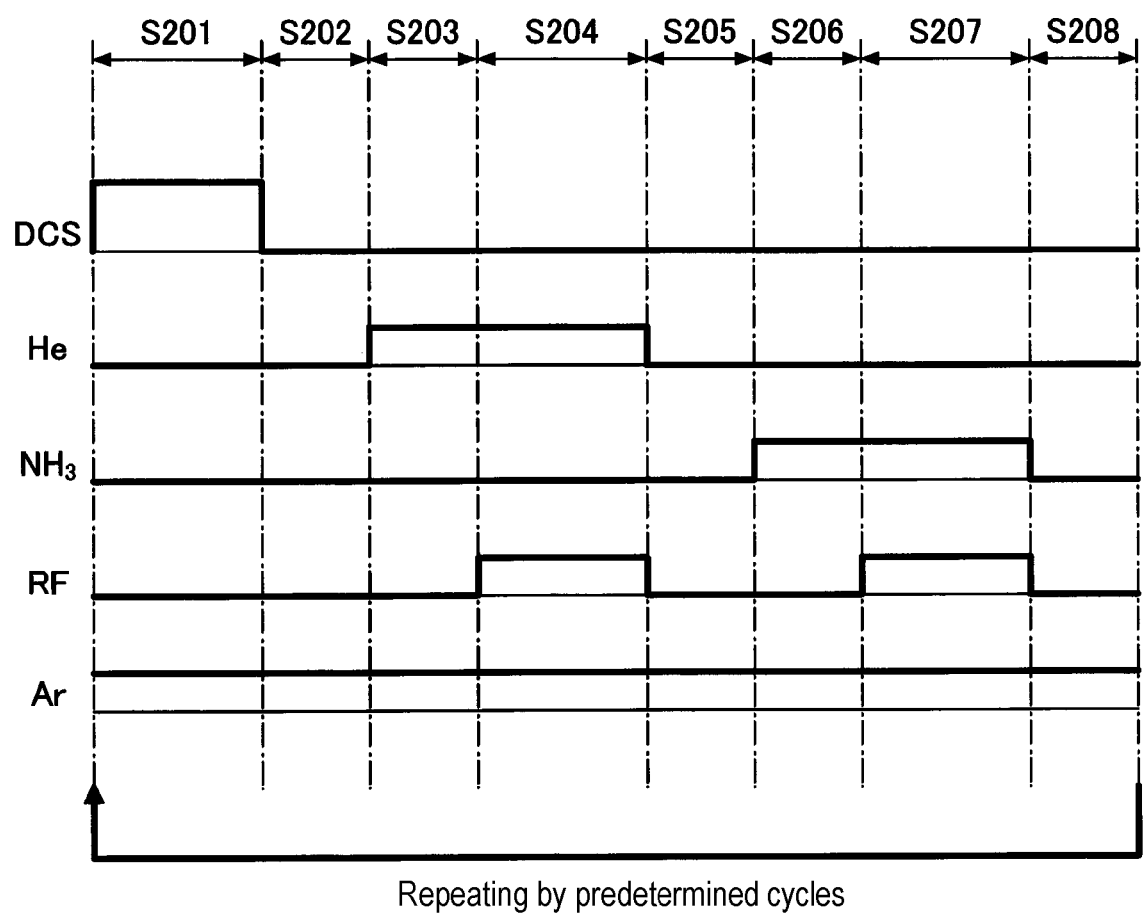
FIG. 4 is a time chart illustrating an example of an operation in the first processing apparatus.

An example of an operation of the processing apparatus 101 will be described with reference to FIG. 4 by taking, as an example, the case of forming the SiN film by the PE-ALD process. FIG. 4 is a time chart illustrating an example of the operation in the first processing apparatus 101.

The PE-ALD process illustrated in FIG. 4 is a process of repeating a precursor gas supply step S201, a purging step S202, a He gas supply step S203, an RF power application step S204, a purging step S205, a reaction gas supply step S206, an RF gas application step S207, and a purging step S208 in predetermined cycles to alternately supply a precursor gas and a reaction gas and form a SiN film having a desired film thickness on the wafer W. In FIG. 4, only one cycle is illustrated.

The precursor gas supply step S201 is a step of supplying the precursor gas to the processing space 38. In the precursor gas supply step S201, first, in the state in which the valves 53e and 54e are opened, the Ar gas is supplied from the Ar gas sources 53a and 54a via the gas supply lines 53b and 54b. In addition, by opening the valve 51e, the precursor gas is supplied to the processing space 38 inside the processing container 1 from the precursor gas source 51a via the gas supply line 51b. In this case, the precursor gas is temporarily stored in the storage tank 51d and then supplied into the processing container 1. As a result, the precursor is adsorbed on the surface of the wafer W so that an adsorption layer of the precursor is formed on the surface of the wafer W.

The purging step S202 is a step of purging the excess precursor gas or the like in the processing space 38. In the purging step S202, the valve 51e is closed to stop the supply of the precursor gas while the supply of the Ar gas via the gas supply lines 53b and 54b is continued. As a result, the Ar gas is supplied to the processing space 38 inside the processing container 1 from the Ar gas sources 53a and 54a via the gas supply lines 53b and 54b. As a result, the excess precursor gas or the like in the processing space 38 is purged. By closing the valve 51e, the storage tank 51d is filled with the precursor gas.

The He gas supply step S203 is a step of supplying the He gas to the processing space 38. In the He gas supply step S203, the valve 55e is opened while the supply of the Ar gas via the gas supply lines 53b and 54b is continued. As a result, the He gas is supplied to the processing space 38 from the He gas source 55a to the processing space 38 via the gas supply line 55b.

The RF power application step S204 is a step of exciting the He gas to plasma. In the RF power application step S204, the plasma is generated in the processing space 38 by applying RF to the upper electrode by the radio-frequency power source 83 while the supply of the Ar gas via the gas supply lines 53b and 54b and the supply of the He gas via the gas supply line 55b are continued. As a result, the adsorption layer on the surface of the wafer W is modified.

The purging step S205 is a step of purging the He gas or the like in the processing space 38. In the purging step S205, the valve 55e is closed to stop the supply of the He gas while the supply of the Ar gas via the gas supply lines 53b and 54b is continued. In addition, the radio-frequency power source 83 stops applying RF to the upper electrode. As a result, the Ar gas is supplied to the processing space 38 inside the processing container 1 from the Ar gas sources 53a and 54a via the gas supply lines 53b and 54b. As a result, the He gas and the like in the processing space 38 are purged.

The reaction gas supply step S206 is a step of supplying the NH$_3$ gas as a reaction gas. In the reaction gas supply step S206, the valve 55e is closed to stop the supply of the He gas and the valve 52e is opened while the supply of the Ar gas via the gas supply lines 53b and 54b is continued. As a result, the reaction gas is supplied to the processing space 38 from the reaction gas source 52a to the processing space 38 via the gas supply line 52b.

The RF power application step S207 is a step of exciting the NH$_3$ gas supplied as a reaction gas to plasma. In the RF power application step S207, the plasma is generated in the processing space 38 by applying RF to the upper electrode by the radio-frequency power source 83 while the supply of the Ar gas via the gas supply lines 53b and 54b and the supply of the reaction gas via the gas supply line 52b are continued. As a result, the adsorption layer on the surface of the wafer W is nitrided to generate the SiN film.

The purging step S208 is a step of purging the excess reaction gas or the like in the processing space 38. In the purging step S208, the valve 52e is closed to stop the supply of the reaction gas while the supply of the Ar gas via the gas supply lines 53b and 54b is continued. In addition, the radio-frequency power source 83 stops applying RF to the upper electrode. As a result, the Ar gas is supplied to the processing space 38 inside the processing container 1 from the Ar gas sources 53a and 54a via the gas supply lines 53b and 54b. As a result, the excess reaction gas and the like in the processing space 38 are purged.

By repeating the above cycle, the SiN film is formed in conformity to an uneven pattern formed on the wafer W.

Here, a preferable range of conditions under which the SiN film is formed using the DCS gas and the NH$_3$ gas in step S101 are shown below.

Temperature: 250 to 600 degrees C.
Pressure: 0.5 to 10 Torr
Flow rate of DCS gas: 10 to 100 cc/cycle
Flow rate of NH$_3$ gas: 500 to 10,000 sccm
Flow rate of He gas: 100 to 10,000 sccm
Flow rate of Ar gas: 500 to 10,000 sccm
Time required for step (S201): 0.05 to 2.0 sec
Time required for step (S202): 0.1 to 2.0 sec
Time required for step (S203): 0.0 to 2.0 sec
Time required for step (S204): 1.0 to 6.0 sec
Time required for step (S205): 0.0 to 2.0 sec
Time required for step (S206): 0.5 to 2.0 sec
Time required for step (S207): 1.0 to 6.0 sec
Time required for step (S208): 0.1 to 2.0 sec
RF power during modification (S204): 10 to 1,000 W
RF power during nitration (S207): 50 to 1,000 W Further, the precursor gas purging step S202 may be omitted, or modifying steps S203 and S204 using the He plasma may be performed after the precursor gas supply step S201. In addition, the He gas may be supplied in a simultaneous manner in a step other than step S207.

Figure 5:
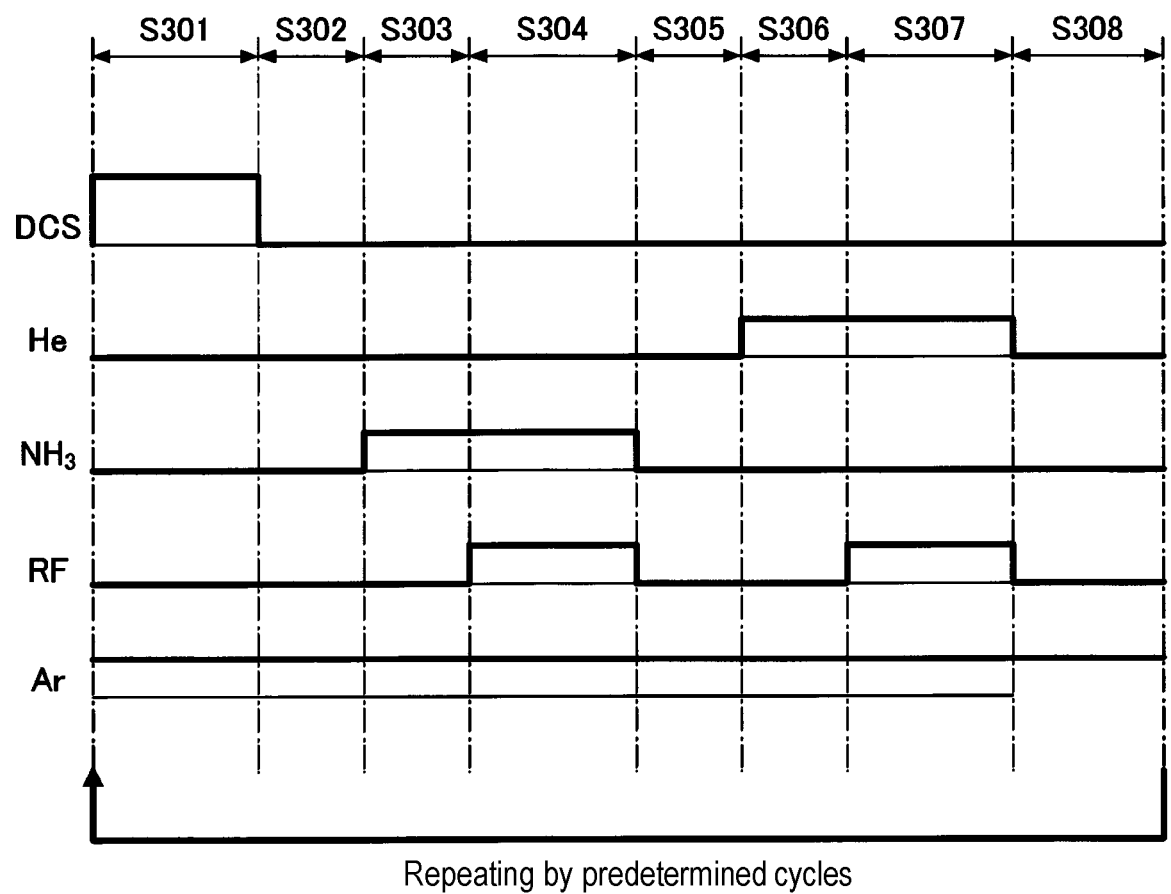
FIG. 5 is a time chart illustrating an example of an operation in the first processing apparatus.

The processing in step S101 is not limited to that illustrated in FIG. 4. Another example of the operation of the processing apparatus 101 will be described with reference to FIG. 5 by taking, as an example, a case of forming a SiN film by the PE-ALD process. FIG. 5 is a time chart illustrating another example of the operation of the first processing apparatus 101.

The PE-ALD process illustrated in FIG. 5 is a process of repeating a precursor gas supply step S301, a purging step S302, a reaction gas supply step S303, an RF power application step S304, a purging step S305, a He gas supply step S306, an RF gas application step S307, and a He gas purging step S308 in predetermined cycles to alternately supply a precursor gas and a reaction gas and form the SiN film having a desired film thickness on the wafer W. In FIG. 5, only one cycle is illustrated.

That is, in the process illustrated in FIG. 4, after adsorption of the precursor gas (S201) and before the nitriding processing of the precursor gas (S206 and S207), modifying processing with the He gas plasma (S203 and S204) is performed.

In contrast, in the process illustrated in FIG. 5, after adsorption (S301) and nitriding processing (S303 and S304) of the precursor gas, modifying processing with the He gas plasma (S306 and S307) is performed. The processing of each step is the same as those of the process illustrated in FIG. 4, and the description thereof will be omitted.

In the process illustrated in FIG. 5, by repeating the above-described cycle, the SiN film is formed in conformity to the uneven pattern formed on the wafer W, as in the case of the process shown in FIG. 4.

Alternatively, after forming the SiN film having a desired film thickness by repeating the adsorption and the nitriding processing of the precursor, a step of modifying the SiN film using He plasma may be performed. In this case, the formation of the SiN film and the modifying with the He plasma may be performed in the same processing apparatus or may be performed in different processing apparatuses.

Further, in the process illustrated in FIG. 4, the step S205 of purging the excess He gas may be omitted. In the process illustrated in FIG. 5, the purging step S308 of purging the excess He gas may be omitted. Furthermore, the modifying with the He gas plasma may be performed both after the adsorption of the precursor gas and after the nitriding processing of the precursor gas.

Returning to FIG. 3, in step S102, the SiN film formed on the wafer W is etched (etching step). This step is processed in, for example, the processing apparatus 102. Here, as will be described later, the SiN film in the concave portion is etched with priority over the SiN film on the upper portion of the pattern. This leaves the SiN film on the upper portion of the pattern. That is, the SiN film is selectively formed on the upper portion of the pattern in step S101 and step S102.

In step S103, it is determined whether or not a repeat termination condition is satisfied. Specifically, steps S101 and S102 are repeated until a predetermined number of repetitions is satisfied (S103, "No") so that the SiN film formed on the upper portion of the pattern has a desired film thickness. When the predetermined number of repetitions is satisfied (S103, "Yes"), the process is terminated.

Figure 6A:
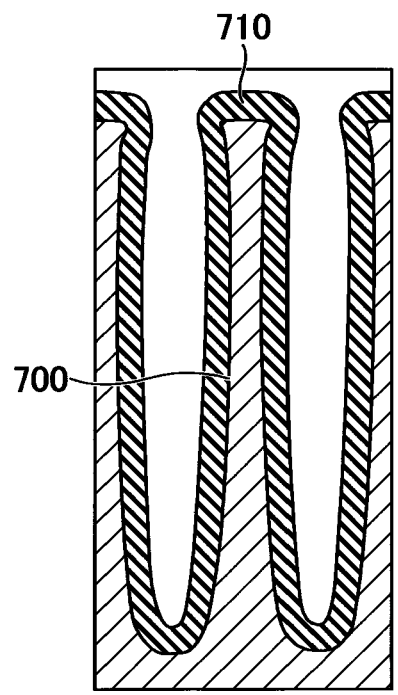
FIG. 6A is an example of a cross-sectional view of a wafer illustrating a SiN film after a SiN film forming step of the present example.
Figure 6B:
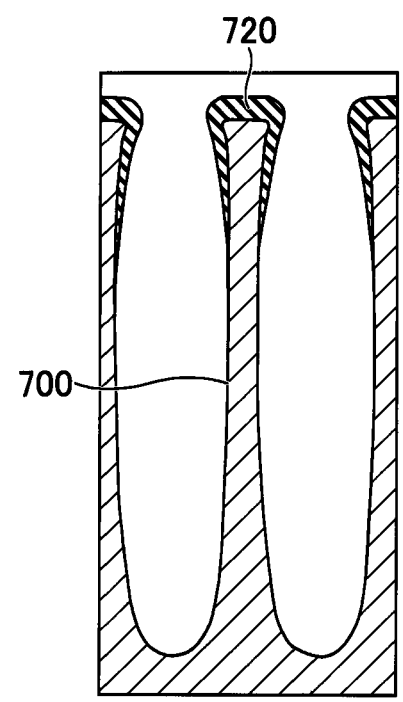
FIG. 6B is an example of a cross-sectional view of a wafer illustrating a SiN film after an etching step of the present example.

FIGS. 6A to 6D are examples of cross-sectional views of the wafer W in the state in which the processing of the SiN film forming step S101 and the etching step S102 were performed. Here, the SiN film forming step S101 and the etching step S102 illustrated in FIG. 3 were performed on the wafer W on which an uneven pattern 700 such as trenches is formed. FIG. 6A is an example of a cross-sectional view of the wafer illustrating a SiN film 710 after the SiN film forming step S101 of the present example. FIG. 6B is an example of a cross-sectional view of the wafer illustrating a SiN film 720 after the etching step S102 of the present example.

Figure 6C:
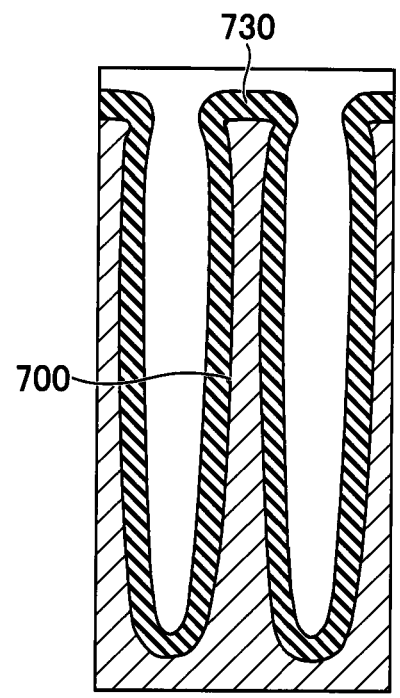
FIG. 6C is an example of a cross-sectional view of a wafer illustrating a SiN film after a SiN film forming step of a reference example.
Figure 6D:
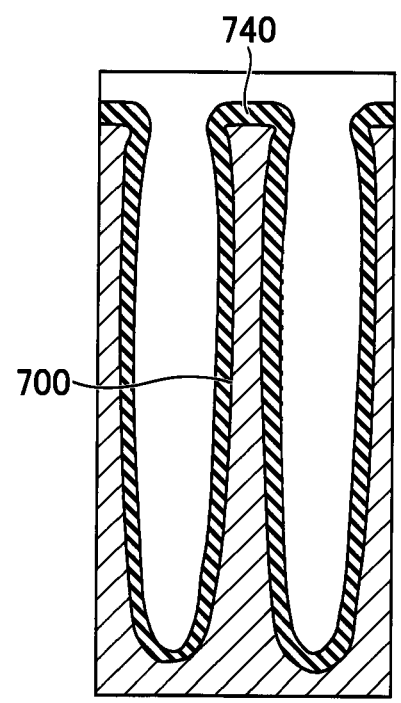
FIG. 6D is an example of a cross-sectional view of a wafer illustrating a SiN film after an etching step of the reference example.

In addition, in a reference example, the modifying gas was changed from the He gas to the $H_2$ gas, and the SiN film forming step S101 and the etching step S102 were similarly performed. FIG. 6C is an example of a cross-sectional view of the wafer illustrating a SiN film 730 after the SiN film forming step S101 of the reference example. FIG. 6D is an example of a cross-sectional view of the wafer illustrating a SiN film 740 after the etching step S102 of the reference example.

In the reference example, as illustrated in FIG. 6C, the SiN film 730 is formed in conformity to the uneven pattern 700 formed on the wafer W by the SiN film forming step S101. Here, in the modifying processing using the $H_2$ plasma illustrated in the reference example, overall modifying is achieved by hydrogen ions, argon ions, and hydrogen radicals so that etching resistance is improved.

As a result, as illustrated in FIG. 6D, the SiN film 740 after the etching process is maintained in the conformal state. That is, the SiN film remains not only in the upper portions of the pattern 700, but also in the concave portions.

In contrast, in the present example, as illustrated in FIG. 6A, the SiN film 710 is formed in conformity to the uneven pattern 700 formed on the wafer W in the SiN film forming step S101. Here, in the modifying processing using the He plasma illustrated in the present example, vacuum ultraviolet (VUV) is emitted by plasmarization of He. In the modifying processing using the He plasma illustrated in the present example, the film is mainly modified by being irradiated with VUV.

On the other hand, the pattern 700 formed on the wafer W has been miniaturized. Therefore, a width of an opening of each concave portion formed in the wafer W is shorter than a wavelength of the VUV. As a result, the VUV incident from the opening becomes near-field light and stays in the vicinity of the entrance of the opening. Thus, the film formed on the sidewalls in the vicinity of the entrance of the opening are modified by the incidence of the VUV which has become the near-field light. Meanwhile, since the VUV does not propagate to the film formed on inner sidewalls or bottoms of the concave portion, the film is not modified by the VUV. The film formed on the upper surface of the concave portion is modified by the incidence of the VUV. That is, in the SiN film 710, the film formed on the upper portion of the pattern 700 (the upper surface of the convex portion and the sidewalls in the vicinity of the entrance of the opening) is selectively modified and improved in the etching resistance. In other words, an etching rate of the SiN film formed on the upper portion of the pattern is lower than that of the SiN film formed on the inner sidewalls or the bottom of the concave portion.

As a result, as illustrated in FIG. 6B, in the SiN film 720 after the etching process, the SiN film formed on the inner sidewalls and the bottoms of the concave portions is preferentially etched, and the SiN film formed on the upper portions of the pattern 700 remains. That is, the SiN film can be selectively formed on the upper portions of the pattern 700 in steps S101 and S102.

Here, the range of the SiN film 720 after the etching process illustrated in FIG. 6B corresponds to the range of the modified SiN film, and further corresponds to the range in which the VUV is irradiated. It is known that an exudation length of the near-field light is about the magnitude of the width of the opening. As illustrated in FIG. 6B, it can be confirmed that the SiN film on the sidewalls in the vicinity of the entrance of the opening after the etching process remains by an amount corresponding to substantially the magnitude of the width of the opening, in other words, the film is modified in the range in which the VUV which has become the near field light stays.

In the foregoing, the film forming method of the present embodiment using the processing apparatuses 101 and 102 has been described. However, the present disclosure is not limited to the above-described embodiment or the like, and various modifications and improvements are possible within the scope of the gist of the present disclosure described in the claims.

The wafers W of the processing apparatuses 101 and 102 has been described to be transferred through the vacuum transfer chamber 200, but the present disclosure is not limited thereto. The wafers W of the processing apparatuses 101 and 102 may be transferred in an atmospheric transfer manner.

In addition, the processing apparatus 101, which performs the formation of the SiN film and the modification using the He plasma, and the processing apparatus 102, which performs the etching process, have been described as being provided separately, but not limited thereto. The formation of the SiN film and the modification using the He plasma, and the etching process may be performed in a single processing apparatus.

In the processing apparatus 101, the precursor gas has been described to be DCS and the reaction gas has been described to be the $NH_3$ gas, but the present disclosure is not limited thereto. As the precursor gas, a silicon-containing gas, such as a halogen-containing silicon-based gas, an aminosilane gas, a $SiH_4$ gas, or a trisilylamine (TSA) gas, may be used. As the reaction gas, a gas such as a $NH_3$ gas or a $N_2$ gas may be used. When the $SiH_4$ gas is used as the precursor gas, the $N_2$ gas may be used as the reaction gas. In addition, in the SiN film forming step S103, the SiN film may be formed by a thermal ALD instead of using the plasma. In this case, a gas such as $NH_3$, hydrazine, or a hydrazine derivative may be used as the reaction gas.

The present application claims priority based on Japanese Patent Application No. 2019-210529 filed on Nov. 21, 2019, the disclosure of which is incorporated herein in its entirety by reference.

EXPLANATION OF REFERENCE NUMERALS 101 to 104: processing apparatus, 200: vacuum transfer chamber, W: wafer, 1: processing container, 2: stage, 3: shower head, 4: exhauster, 5: gas supply mechanism (gas source), 51a: precursor gas source, 52a: reaction gas source, 53a: Ar gas source, 54a: Ar gas source, 55a: He gas source, 8: RF power supply (radio-frequency power supply), 83: radio-frequency power source, 9: controller

What is claimed is:

1. A substrate processing method comprising:
   forming a silicon-containing film by repeating forming an adsorption layer on a substrate on which a pattern of a concave portion is formed by supplying a silicon-containing gas to the substrate and generating plasma of a reaction gas to cause the plasma to react with the adsorption layer; and
   etching the silicon-containing film,
   wherein the forming the silicon-containing film includes modifying at least one of the adsorption layer or the silicon-containing film by generating a He-containing plasma, and
   wherein an opening width of the concave portion is shorter than a wavelength of light emitted from the He-containing plasma.

2. The substrate processing method of claim 1, wherein, in the modifying the at least one of the adsorption layer or the silicon-containing film:
   the He-containing plasma emits the light; and
   the at least one of the adsorption layer or the silicon-containing film is modified by being irradiated with the light emitted from the He-containing plasma.

3. The substrate processing method of claim 2, wherein, in the modifying the at least one of the adsorption layer or the silicon-containing film, the at least one of the adsorption layer or the silicon-containing film formed on an upper portion of the pattern formed on the substrate is modified.

4. The substrate processing method of claim 3, wherein, the modifying the at least one of the adsorption layer or the silicon-containing film improves an etching resistance of the silicon-containing film.

5. The substrate processing method of claim 4, wherein the modifying the at least one of the adsorption layer or the silicon-containing film is performed after repeating the forming the adsorption layer and the generating the plasma of the reaction gas.

6. The substrate processing method of claim 5, wherein the forming the silicon-containing film and the etching the silicon-containing film are repeated.

7. The substrate processing method of claim 6, wherein the silicon-containing film is a SiN film.

8. The substrate processing method of claim 7, wherein the silicon-containing gas includes at least one selected from the group consisting of a halogen-containing silicon-based gas, an aminosilane gas, a $SiH_4$ gas, and a trisilylamine (TSA) gas.

9. The substrate processing method of claim 8, wherein the reaction gas includes at least one selected from the group consisting of a $NH_3$ gas, a $N_2$ gas, a hydrazine, and a hydrazine derivative gas.

10. The substrate processing method of claim 1, wherein, in the modifying the at least one of the adsorption layer or the silicon-containing film, the at least one of the adsorption layer or the silicon-containing film formed on an upper portion of the pattern formed on the substrate is modified.

11. The substrate processing method of claim 1, wherein, the modifying the at least one of the adsorption layer or the silicon-containing film improves an etching resistance of the silicon-containing film.

12. The substrate processing method of claim 1, wherein the modifying the at least one of the adsorption layer or the silicon-containing film is performed after the forming the adsorption layer.

13. The substrate processing method of claim 1, wherein the modifying the at least one of the adsorption layer or the silicon-containing film is performed after the generating the plasma of the reaction gas.

14. The substrate processing method of claim 1, wherein the modifying the at least one of the adsorption layer or the silicon-containing film is performed after repeating the forming the adsorption layer and the generating the plasma of the reaction gas.

15. The substrate processing method of claim 1, wherein the forming the silicon-containing film and the etching the silicon-containing film are repeated.

16. The substrate processing method of claim 1, wherein the silicon-containing film is a SiN film.

17. The substrate processing method of claim 1, wherein the silicon-containing gas includes at least one selected from the group consisting of a halogen-containing silicon-based gas, an aminosilane gas, a $SiH_4$ gas, and a trisilylamine (TSA) gas.

* * * * *